(12) United States Patent
Ohama et al.

(10) Patent No.: US 7,587,912 B2
(45) Date of Patent: Sep. 15, 2009

(54) METHOD FOR PRODUCING QUARTZ GLASS CRUCIBLE FOR USE IN PULLING SILICON SINGLE CRYSTAL AND QUARTZ GLASS CRUCIBLE PRODUCED BY SAID METHOD

(75) Inventors: Yasuo Ohama, Takefu (JP); Hiroshi Matsui, Takefu (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 362 days.

(21) Appl. No.: 10/547,053

(22) PCT Filed: Feb. 20, 2004

(86) PCT No.: PCT/EP2004/001663

§ 371 (c)(1),
(2), (4) Date: Aug. 24, 2005

(87) PCT Pub. No.: WO2004/076725

PCT Pub. Date: Sep. 10, 2004

(65) Prior Publication Data

US 2006/0174651 A1    Aug. 10, 2006

(30) Foreign Application Priority Data

Feb. 28, 2003   (JP)   ............... 2003-052704

(51) Int. Cl.
    *C03B 19/09*   (2006.01)
(52) U.S. Cl. ....................................... 65/17.3
(58) Field of Classification Search ............ 65/17.3
    See application file for complete search history.

(56) References Cited

U.S. PATENT DOCUMENTS 5,174,801 A    12/1992   Matsumura et al.

(Continued)

FOREIGN PATENT DOCUMENTS

JP        01-148718       12/1989

(Continued)

OTHER PUBLICATIONS

Patent Abstracts of Japan, vol. 018, No. 262, May 19, 1994, for JP 06 040713 A (Feb. 15, 1994).

(Continued)

*Primary Examiner*—Steven P Griffin
*Assistant Examiner*—Russell J Kemmerle, III
(74) *Attorney, Agent, or Firm*—Tiajoloff and Kelly LLP

(57) ABSTRACT

The present invention refers to a method for producing a quartz glass crucible for use in pulling silicon single crystal, said crucible having at least a double-layer structure comprising a pore-free transparent inner layer and an opaque base body or outer layer having pores, characterized in that at least the base body is formed with a silica powder maintained in a gas having a mixing ratio of 0.0005 to 0.0065 kg/kg (dry gas), and a quartz glass crucible produced by said production method. The obtained crucible has an average OH group concentration of 50 ppm or lower and is capable of suppressing the vibration occurring on the surface of silicon melt during pulling the silicon single crystal. Further the obtained crucible suffers less deformation of the crucible on pulling the silicon single crystal.

4 Claims, 1 Drawing Sheet

U.S. PATENT DOCUMENTS

Figure 1:
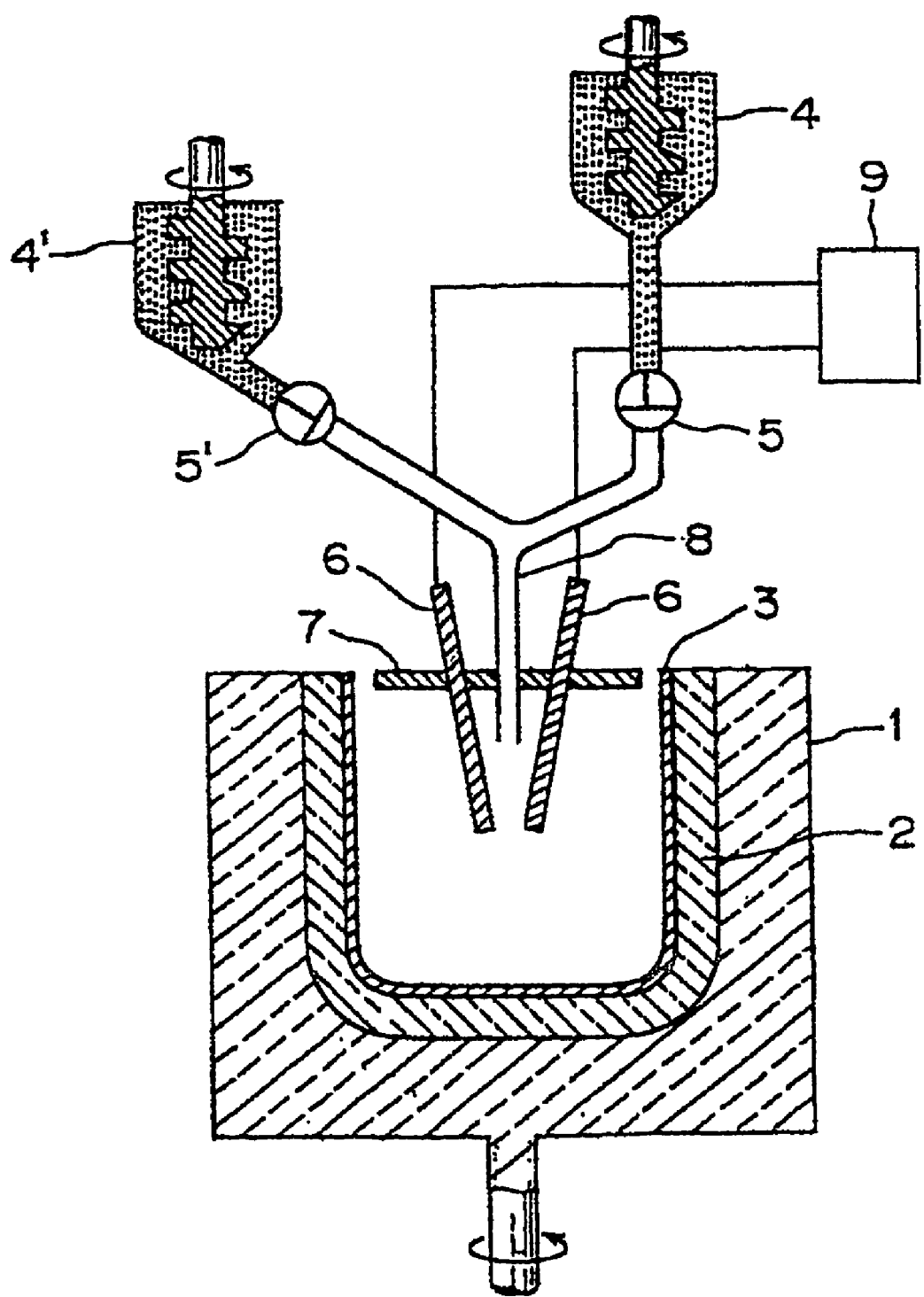

| | | | | |
|---|---|---|---|---|
| 5,334,232 | A | * | 8/1994 | France et al. ............... 65/388 |
| 5,720,809 | A | * | 2/1998 | Iino et al. ............... 117/213 |
| 5,772,714 | A | * | 6/1998 | Sato et al. ............... 65/17.5 |
| 5,977,000 | A | * | 11/1999 | Sato et al. ............... 501/39 |
| 6,652,934 | B1 | * | 11/2003 | Miyao et al. ............... 428/34.4 |
| 6,672,107 | B2 | * | 1/2004 | Werdecker et al. ............... 65/17.4 |
| 6,841,210 | B2 | | 1/2005 | Ohama et al. |
| 2002/0192409 | A1 | | 12/2002 | Ohama et al. |

FOREIGN PATENT DOCUMENTS

| | | |
|---|---|---|
| JP | 04-022861 | 1/1992 |
| JP | 05-105577 | 4/1993 |
| JP | 06-040713 | 2/1994 |
| JP | 06 040713 A | 2/1994 |
| JP | 08-169798 | 7/1996 |
| JP | 2001-348294 | 12/2001 |

OTHER PUBLICATIONS

Patent Abstracts of Japan for JP 04-022861 (Jan. 27, 1992).
Patent Abstracts of Japan for JP 01-148718 (Dec. 6, 1989).
Patent Abstracts of Japan for JP 08-169798 (Jul. 2, 1996).
Patent Abstracts of Japan for JP 05-105577 (Apr. 27, 1993).
Patent Abstracts of Japan for JP 06-040713 (Feb. 15, 1994).
Patent Abstracts of Japan for 2001-348294 (Dec. 18, 2001).

* cited by examiner

METHOD FOR PRODUCING QUARTZ GLASS CRUCIBLE FOR USE IN PULLING SILICON SINGLE CRYSTAL AND QUARTZ GLASS CRUCIBLE PRODUCED BY SAID METHOD

INDUSTRIAL FIELD OF APPLICATION

The present invention relates to a production method for a quartz glass crucible to be used for pulling up a silicon single crystal for semiconductor production. Further the present invention relates to a quartz glass crucible to be obtained by the aforementioned production method.

PRIOR ART

Conventionally, in production of a silicon single crystal for semiconductor production, a so-called Czochralski method (CZ method) in which a silicon polycrystal is allowed to be melted in a crucible made of quartz glass and, then, a seed crystal of a silicon single crystal is dipped in the resulting silicon melt and, thereafter, the seed crystal is gradually pulled up while the crucible is rotated to allow the silicon single crystal to be crystalwise grown by using the seed crystal as a nucleus has widely been adopted. It is required that such single crystal to be produced by using the aforementioned CZ method is not only highly pure, but also capable of producing silicon wafers with a good yield. As the quartz glass crucible which satisfies such requirement, there is provided a quartz glass crucible having a double-layer constitution comprising an inner layer free of air bubbles and an opaque outer layer containing the air bubbles (see Japanese Patent Publication No. 01-148718). In recent years, along with a trend toward a larger diameter of the silicon single crystal, a time period of work for pulling up the single crystal becomes longer whereupon it has come to be required that the quartz glass crucible has a still higher degree of purity. In order to satisfy such requirement, a quartz glass crucible in which the inner layer is formed by using synthetic quartz glass powder has been proposed (see JP08-169798 or JP05-105577).

On the other hand, due to such longer time period of work for pulling up the single crystal, heat load put on the quartz glass crucible has increased, thereby causing deformation thereon such that an upper end part of the quartz glass crucible is folded inward or sank (hereinafter referred to simply as "deformation") in the process of pulling up the silicon single crystal. In order to prevent the deformation, a method for bringing silica powder into contact with a chlorine gas or a chlorinated compound to decrease a concentration of OH group contained therein has been proposed (see JP 06-040713).

PROBLEMS THAT THE INVENTION IS TO SOLVE

However, the quartz glass crucible having the inner layer made of the aforementioned synthetic quartz glass had a defect such that a surface of a melt was liable to be vibrated at the time the silicon polycrystal was melted. When the vibration is generated on the surface of the melt, not only a long time period is required for seeding work, but also crystallization is disturbed, thereby bringing about deterioration of productivity. For this reason, a quartz glass crucible having the multi-layer constitution free of the aforementioned defect in which an opaque intermediate layer made of the synthetic quartz glass is arranged between a transparent inner layer made of the synthetic quartz glass and an opaque outer layer made of natural quartz glass has been proposed (see JP2001-34294). Nevertheless, this quartz glass crucible was not able to sufficiently suppress the deformation of the crucible to be caused at the time of pulling up the silicon single crystal.

Further, in the method in which the silica powder that is a starting material of the aforementioned crucible is brought into contact with the chlorine gas or the chlorinated compound, the concentration of OH group contained in the silica powder can surely be decreased; however, there was a problem, depending on storage conditions of silica powder subjected to such treatment, that a large quantity of moisture was adsorbed on the surface of the silica powder to increase such OH group concentration of the crucible itself.

In view of the present situations as described above, the present inventors have exerted an intensive study and, as a result, have found that, by holding silica power to be used at the time of producing the quartz glass crucible in a gas having a specified humidity mixing ratio, a quartz glass crucible can be obtained in which an OH group concentration of the quartz glass crucible itself can be decreased, deformation to be generated at the time of pulling up the silicon single crystal can be minimized, and a vibration of a surface of a silicon melt to be generated by heat convection can be suppressed. Namely, an object of the present invention is to provide a production method for a quartz glass crucible in which a vibration on a surface of a silicon melt is suppressed and deformation to be generated at the time of pulling up a silicon single crystal is minimized.

Another object of the present invention is to provide a quartz glass crucible to be obtained by the aforementioned production method.

MEANS FOR SOLVING THE PROBLEMS

The present invention for solving the aforementioned object relates to a production method for a quartz glass crucible for pulling up a silicon single crystal which has at least a two-layer constitution comprising a transparent inner layer free of air bubbles and an opaque base body or so-called "outer layer" containing air bubbles, being characterized in that at least the aforementioned base body is formed by silica powder held in a gas having a humidity mixing ratio of 0.0005 to 0.0065 kg/kg (dry gas). The present invention for solving the aforementioned object further relates to a a quartz glass crucible to be obtained by the aforementioned production method.

The term "humidity mixing ratio" used herein refers to a value measured by a measuring method based on a vapor absorption method set by Japanese Industry Standard JIS Z8806, and is expressed by weight [kg/kg (dry gas)] of vapor brought in by 1 kg of dry gas. Further, the term is also called as "absolute humidity" in the industrial field of air-conditioning. Examples of such gases include air, inert gases such as nitrogen and helium.

Ordinarily, as for the silica powder to be used for production of the quartz glass crucible, a particle diameter thereof is as fine as 100 to 500 μm, a specific surface area thereof is large due to a nearly spherical shape thereof, and moisture is easily adsorbed on a surface thereof under an environment of high humidity and the thus-adsorbed moisture is fixed in the crucible as an OH group at the time the silica powder is melted, thereby decreasing heat resistance of the crucible. For this reason, in the production method of the quartz glass crucible according to the present invention, the silica powder to be used for production of the quartz glass crucible is held in a gas having a humidity mixing ratio of 0.0005 to 0.0065 kg/kg (dry gas), and preferably 0.001 to 0.0045 kg/kg (dry gas).

Examples of Production Methods for Quartz Glass Crucibles Include (i) a method comprising the steps of feeding silica powder along an inner peripheral surface of a rotating gas-permeable mold; melting the piled-up layer of the silica powder by heat from a side of the inner peripheral surface of the mold; and, in the process of such melting, suck-discharging gas present in the piled-up layer of the silica powder through a wall of the gas-permeable mold by reducing pressure in an outer peripheral part of the mold, thereby allowing a crucible shape to be formed;

(ii) a production method for a quartz glass crucible comprising the steps of: feeding silica powder in a rotating mold; forming the thus-fed silica powder into a green compact in a crucible shape by centrifugal force; melting the green compact by heat to form a crucible base body made of translucent quartz glass; in or after the process of forming the crucible base body, feeding fresh silica powder, preferably synthetic silica powder into a heating atmosphere of the crucible base body; and forming a transparent quartz glass layer in an inner surface side of the crucible base body, and (iii) a production method for a quartz glass crucible having a multi-layer constitution as described in Patent Document 4.

In the production method according to the present invention, it is essential to use the silica powder in which the outer layer, forming the base body, is held in the gas having a moisture mixing ratio of at least 0.0005 to 0.0065 kg/kg (dry gas), and preferably 0.001 to 0.0045 kg/kg (dry gas). Through producing the quartz glass crucible by using the silica powder held in the aforementioned moisture mixing ratio, an average OH group concentration of the quartz glass itself becomes 50 ppm or less whereupon not only high temperature resistance becomes high and deformation is not generated at the time of pulling up the silicon single crystal, but also a fluctuation of air-bubble distribution in the base body or outer layer is minimized and the vibration of the surface of the silicon melt to be caused by heat convection or the like is suppressed. It is technically difficult to allow holding of the aforementioned silica powder to be in a moisture mixing ratio of less than 0.0005 kg/kg (dry gas) and, further, when the moisture mixing ratio is over 0.0065 kg/kg (dry gas), the OH group concentration of the crucible itself is increased whereupon, not only the high temperature resistance is decreased and deformation is liable to be generated, but also the fluctuation of the air-bubble distribution in the outer layer is generated and, further, the vibration of the surface of the silicon melt by the heat convection or the like is generated. As for silica powder to be used, natural silica powder of high purity, synthetic silica powder and the like are mentioned; however, the natural silica powder having high heat resistance is preferably used for forming the base body or outer layer.

In holding the aforementioned silica powder, the temperature is preferably set in the range of from −5° C. to +18° C. In order to hold the silica powder at the moisture mixing ratio of 0.0065 kg/kg or less (dry gas) while the temperature is over 18° C., it is required to drastically decrease relative humidity whereupon a size of production facility becomes large to cause a cost increase. Further, when the temperature is less than −5° C., moisture to be adsorbed on the silica powder is frozen whereupon it becomes difficult to remove moisture therefrom.

MODE FOR CARRYING OUT THE INVENTION

Embodiments of the present invention will now be described with reference to the accompanying drawing. It will be understood that the examples are given to illustrate the invention and various types of embodiments are possible unless they depart from the technical idea of the invention.

FIG. 1 shows an embodiment of a production method for a quartz glass crucible according to the present invention. In FIG. 1, in regard to reference numerals and signs, 1 represents a rotating mold; 2 represents a quartz glass crucible base body (outer layer); 3 represents a transparent quartz glass layer (inner layer); 4 and 4' each represent a silica powder storage hopper; 5 and 5' each represent a flow volume control valve; 8 represents a silica powder supply device; 6 represents an arc electrode; and 9 represents an arc power supply. A body in a quartz glass crucible shape is formed on a surface of an inner wall of a mold 1 by centrifugal force by the steps of introducing the silica powder, preferably natural silica powder, into the silica powder storage hopper 4 as shown in FIG. 1; holding the inside of the silica powder storage hopper in an atmosphere of a gas having a moisture mixing ratio of 0.0005 to 0.0065 kg/kg (dry gas), preferably 0.001 to 0.0045 kg/kg (dry gas); opening the flow volume control valve 5; and loading the silica powder previously introduced into the silica powder storage hopper 4 into the rotating mold 1 through the silica powder supply device 8. The upperside of the mold 1 is covered by a lid body 7. The inside of a cavity of the body in a quartz glass crucible shape is allowed to be in an atmosphere of high temperature gas by using the arc electrode 6 to transform at least a part of the body into a molten glass state whereupon a quartz glass crucible base body in which at least the outer layer 2 is made of translucent quartz glass is formed and, subsequently, the silica powder, preferably synthetic silica powder, is supplied from the silica powder storage hopper 4' into a high temperature atmosphere of the quartz glass crucible base body 2 to transform the thus-supplied silica powder into a molten glass state whereupon an inner layer (transparent quartz glass layer) 3 is formed, thereby producing the quartz glass crucible. In the foregoing production method, it is preferable that the silica powder to be supplied into the storage hopper 4 is first held in the gas having a moisture mixing ratio of 0.0005 to 0.0065 kg/kg (dry gas), preferably 0.001 to 0.0045 kg/kg (dry gas) and, then, transferred into the storage hopper. By performing such treatment, the silica powder is prevented from adsorbing moisture whereupon the quartz glass crucible having excellent characteristics can be produced in an efficient manner.

EXAMPLE 1

By using an apparatus as shown in FIG. 1, after an inside of a silica powder storage hopper 4 which stored natural silica powder was held in an atmosphere of air having a moisture mixing ratio of 0.0042 kg/kg (dry air) (10° C., relative humidity: 55%), a flow volume control valve 5 was opened to allow the natural silica powder to be loaded into a rotating mold 1 through a silica powder supply device 8, thereby forming a body in a quartz glass crucible shape by centrifugal force. Thereafter, an arc electrode 6 was inserted in the thus-formed body in the quartz glass crucible shape to allow a cavity of an inner part thereof to be in an atmosphere of high temperature gas, thereby transforming the body into a molten glass state and, then, the resultant body in the molten glass state was cooled to form a translucent quartz glass crucible base body 2. Subsequently, while rotating the mold 1, an inside of the cavity of the quartz glass crucible base body was allowed to be in a high temperature atmosphere by using the arc electrode and, then, the synthetic silica powder of high purity was supplied from the silica powder storage hopper 4' through the silica powder supply device 8 and, thereafter, the thus-supplied synthetic silica powder was transformed into a transparent quartz glass state to form an inner layer 3 whereupon a quartz glass crucible having a size of 24 inches was produced. By using the thus-produced quartz glass crucible, a silicon single crystal was pulled up by means of a CZ method whereupon no vibration was generated on a surface of a silicon melt, no deformation was generated of the crucible whereupon a perfect silicon single crystal was able to be grown in about 90 hours. An average OH group concentration of the outer layer of the aforementioned quartz glass crucible was 35 ppm.

COMPARATIVE EXAMPLE 1

A quartz glass crucible having a size of 24 inches was produced in a same manner as in Example 1 except that base body 2 was prepared by natural silica powder held in air having a moisture mixing ratio of 0.0119 kg/kg (dry air) (25° C.; relative humidity: 60% in Example 1). By using the thus-produced quartz glass crucible, a silicon single crystal was pulled up by means of a CZ method whereupon a vibration was noticed on a surface of a silicon melt. When a production operation was performed for about 60 hours, deformation was generated on an upper end part of the crucible, thereby stopping the production operation. An average OH concentration of the outer layer of the aforementioned quartz glass crucible was 70 ppm.

ADVANTAGE OF THE INVENTION

According to the production method of the present invention, in addition to a feature that there is no vibration on the surface of the silicon melt to be generated at the time of pulling up the silicon single crystal, the quartz glass crucible in which deformation to be generated at the time of pulling up the silicon single crystal is minimized can easily be produced. Further, the quartz glass crucible produced according to the aforementioned production method is low in the OH group concentration, thereby being high in heat resistance.

The invention claimed is:

1. A method for producing a quartz glass crucible for use in pulling silicon single crystal, said method comprising:
    forming said quartz glass crucible so as to have at least a double-layer structure comprising a pore-free transparent inner layer and an opaque base body having pores therein, including forming at least the base body of the crucible with a silica powder, wherein, prior to said forming the base body, the silica powder is maintained in a storage hopper in a gas having a humidity mixing ratio of 0.0005 to 0.0065 kg/kg (dry gas) and kept at a temperature of −5° C. to +18° C. so as to prevent absorption of moisture by the silica powder.

2. A method for producing a quartz glass crucible for use in pulling silicon single crystal as claimed in claim 1, wherein the silica powder is maintained in a gas having a mixing ratio of 0.001 to 0.0045 kg/kg (dry gas).

3. A method for producing a quartz glass crucible for use in pulling silicon single crystal as claimed in claim 2, wherein the inner layer is formed using synthetic silica.

4. A method for producing a quartz glass crucible for use in pulling silicon single crystal as claimed in claim 1, wherein the inner layer is formed using synthetic silica.

* * * * *